US008286116B1

(12) United States Patent
Endo et al.

(10) Patent No.: US 8,286,116 B1
(45) Date of Patent: *Oct. 9, 2012

(54) COMPOSITE WIRE INDEXING FOR PROGRAMMABLE LOGIC DEVICES

(75) Inventors: Toshikazu Endo, San Jose, CA (US); Byung-Kyoo Kang, Cupertino, CA (US); Guanqun Zhou, San Ramon, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 106 days.

This patent is subject to a terminal disclaimer.

(21) Appl. No.: 12/871,764

(22) Filed: Aug. 30, 2010

Related U.S. Application Data (63) Continuation of application No. 11/947,662, filed on Nov. 29, 2007, now Pat. No. 7,788,623.

(51) Int. Cl.
*G06F 17/50* (2006.01)
(52) U.S. Cl. .................................................. 716/128
(58) Field of Classification Search .......................... None
See application file for complete search history.

(56) References Cited

U.S. PATENT DOCUMENTS

| 6,086,629 | A  | * | 7/2000 | McGettigan et al. | 716/113 |
|---|---|---|---|---|---|
| 6,738,961 | B2 | * | 5/2004 | Snider | 716/128 |
| 7,068,072 | B2 | * | 6/2006 | New et al. | 326/47 |
| 7,107,565 | B1 | * | 9/2006 | Lindholm et al. | 716/117 |
| 7,132,853 | B2 | * | 11/2006 | Feng et al. | 326/41 |
| 7,185,306 | B1 | * | 2/2007 | Leventis et al. | 716/102 |
| 7,536,668 | B1 | * | 5/2009 | Reynolds et al. | 716/138 |
| 7,584,448 | B1 | * | 9/2009 | Reynolds et al. | 716/138 |
| 7,779,379 | B2 | * | 8/2010 | Tai et al. | 716/126 |
| 2008/0288909 | A1 | * | 11/2008 | Leijten-Nowak | 716/16 |

* cited by examiner

*Primary Examiner* — Leigh Garbowski (57) ABSTRACT

Various techniques are disclosed to identify composite wires from segmented wires of a programmable logic device (PLD). In one example, a method includes associating segmented wires of the PLD with a plurality of wire index values based on connections identified by interface templates. The method further includes identifying a plurality of composite wires according to the wire index values. Each composite wire comprises a set of the segmented wires associated with a corresponding one of the wire index values. The composite wires are adapted to interconnect programmable logic blocks of the PLD.

18 Claims, 8 Drawing Sheets

COMPOSITE WIRE INDEXING FOR PROGRAMMABLE LOGIC DEVICES

RELATED APPLICATION DATA

This application is a continuation of U.S. application Ser. No. 11/947,662, filed Nov. 29, 2007, now U.S. Pat. No. 7,788, 623, which is incorporated herein by reference in its entirety.

TECHNICAL FIELD

The present invention relates generally to programmable logic devices and, more particularly, to connections between components of programmable logic devices.

BACKGROUND

Programmable logic devices (PLDs), such as field programmable gate arrays (FPGAs) or complex programmable logic devices (CPLDs), may be configured to provide user-defined features. In this regard, PLDs typically include logic blocks that are used to perform various logic operations. The configuration of the logic blocks and their interconnections are specified by configuration data programmed into configuration memory of the PLD. To prepare the configuration data, software may be used to identify individual segmented wires that are connected together within the PLD to provide longer wires for interconnecting the logic blocks.

However, conventional approaches used to identify connected segmented wires are often inefficient. In one approach, software is used to search for segmented wires of a PLD on a case-by-case basis for each logic block to be connected. For example, if a first segmented wire connected to a first logic block is found, then adjacent areas of the PLD are searched to find an additional segmented wire connected to the first segmented wire. The two segmented wires may be referenced together as a new wire, and additional segmented wires may be searched and added to the new wire until a set of segmented wires between the first logic block and a second logic block can be determined and referenced together as a new wire.

Unfortunately, in the above approach, the process of searching and identifying segmented wires must be repeated for each interconnection between logic blocks of the PLD. In addition, as each additional segmented wire is found, wire information (e.g., wire position, wire graphical information, and other details) must be created, updated, and/or deleted. As a result, this approach can become cumbersome and time-intensive as each new wire is repeatedly updated to include additional segmented wires, and previously identified new wires are added to other new wires and deleted. Moreover, as PLDs grow in size (for example, at a linear rate), the time to search for and identify segmented wires also increases (for example, at a quadratic rate).

As a result, there is a need for an improved approach to the identification of segmented wires to facilitate the interconnection of PLD logic blocks. In particular, there is a need for such an approach that permits large wires comprised of smaller segmented wires to be easily identified.

SUMMARY

Various techniques are disclosed to identify composite wires from segmented wires of a programmable logic device (PLD). In one example, a method includes associating segmented wires of the PLD with a plurality of wire index values based on connections identified by interface templates. The method further includes identifying a plurality of composite wires according to the wire index values. Each composite wire comprises a set of the segmented wires associated with a corresponding one of the wire index values. The composite wires are adapted to interconnect programmable logic blocks of the PLD.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with various techniques described herein, composite wires may be identified from a plurality of individual segmented wires of a programmable logic device (PLD). For example, in one embodiment, interface templates corresponding to adjacent tiles of a PLD are created and used to identify patterns of segmented wires connected between the adjacent tiles. The connected segmented wires are associated with index values used to reference the connected segmented wires together as composite wires. Additional segmented wires contained within the tiles are also associated with corresponding index values to be identified as additional composite wires.

Advantageously, the various composite wires of a PLD may be identified before interconnections between logic blocks of the PLD are specified. As a result, such interconnections may be specified using the identified composite wires, rather than searching for individual segmented wires on a case-by-case basis for each interconnected logic block.

Figure 1:
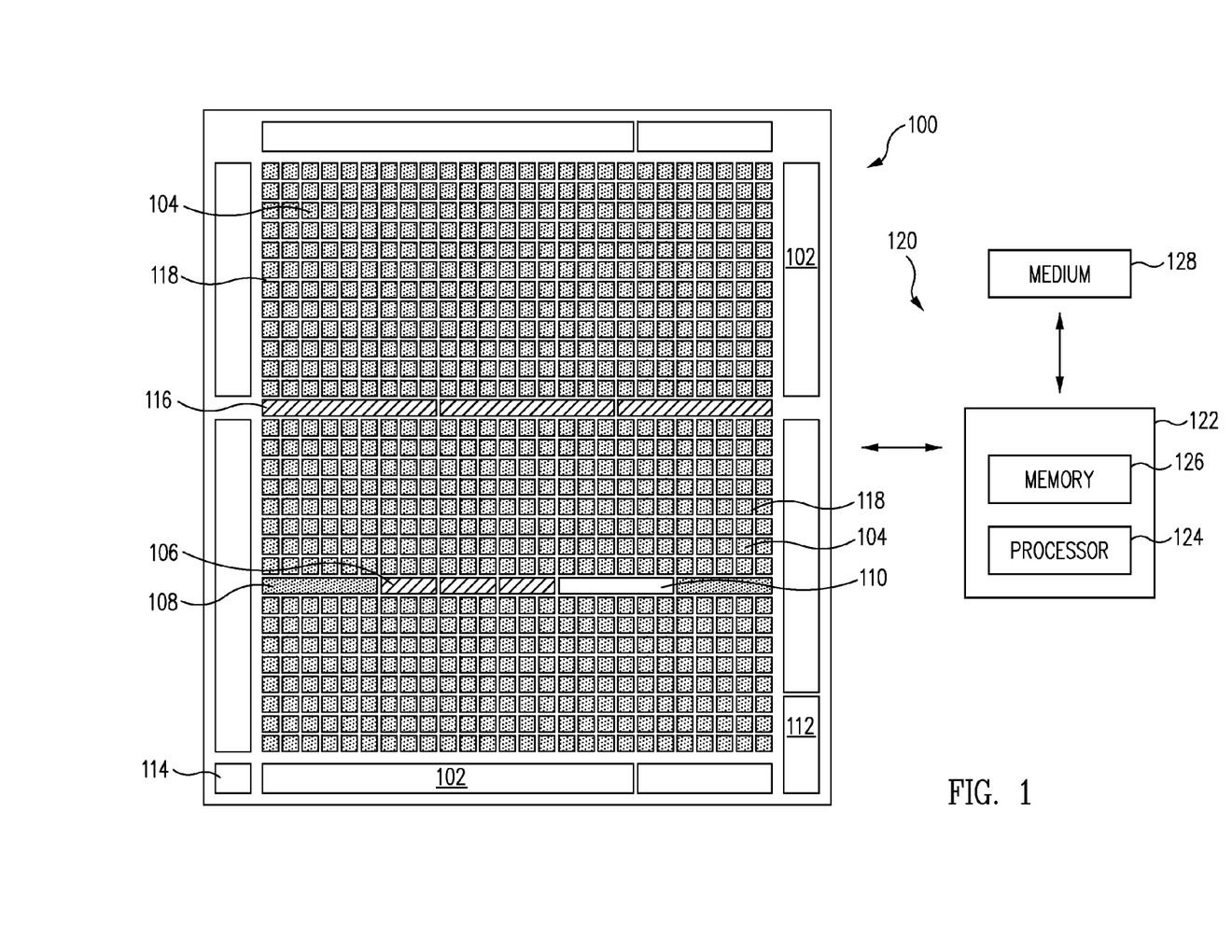
FIG. 1 illustrates a block diagram of a programmable logic device (PLD) and a system for generating configuration data for use with the PLD in accordance with an embodiment of the invention.

FIG. 1 illustrates a block diagram of a programmable logic device (PLD) 100 and a system 120 for generating configuration data for use with PLD 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

System 120 includes a computing device 122 and a computer readable medium 128. As shown, computing device 122 includes a processor 124 and a memory 126. Processor 124 may be configured with appropriate software (e.g., a computer program for execution by a computer) that is stored on computer readable medium 128 and/or in memory 126 to instruct processor 124 to perform one or more of the operations described herein.

For example, in one embodiment, means such as processor 124 configured with such software may be used to identify a plurality of interface templates corresponding to tiles of PLD 100, associate the segmented wires of PLD 100 with a plurality of wire index values based on the connections identified by the interface templates, and identify a plurality of composite wires according to the wire index values.

Processor 124 and memory 126 may be implemented in accordance with any appropriate components that may be used to provide computing system 120. Similarly, computer readable medium 128 may be implemented using any appropriate type of machine-readable medium used to store software. System 120 may be implemented to provide configuration data prepared by system 120 to PLD 100 through, for example, configuration port 112.

PLD 100 may be implemented as a plurality of tiles, with each tile corresponding to a portion of the device area provided by PLD 100. A small number of tile templates may be used to identify various programmable logic blocks 104 and routing resources 118 of PLD 100. Each of these tile templates may be duplicated to provide a plurality of tiles that are collectively used to implement programmable logic blocks 104 and routing resources 118 of PLD 100. For example, in one embodiment, such tiles may be implemented as a grid of approximately 200 tiles by approximately 200 tiles.

Figure 2:
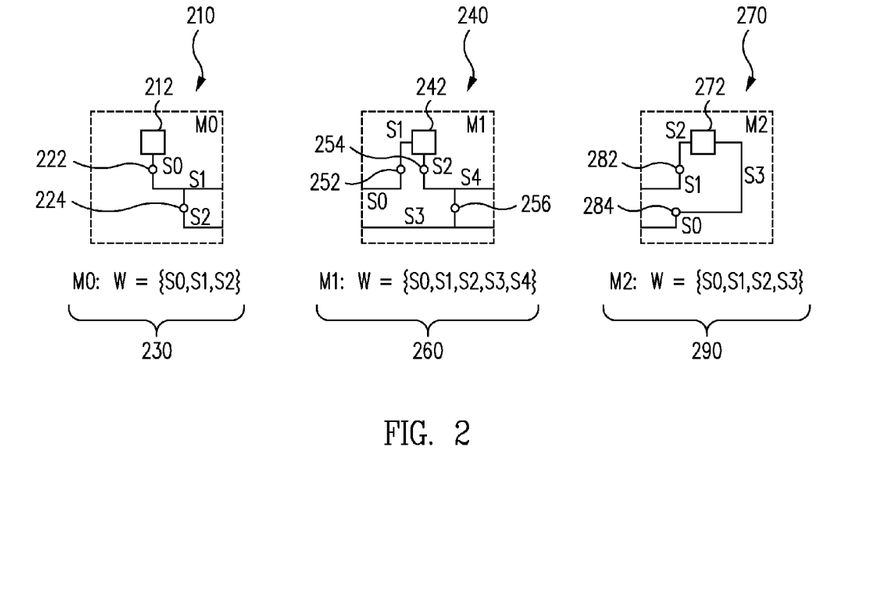
FIG. 2 illustrates a plurality of tile templates in accordance with an embodiment of the invention.

FIG. 2 illustrates a plurality of tile templates 210 (labeled M0), 240 (labeled M1), and 270 (labeled M2) that may be used to implement programmable logic blocks 104 and routing resources 118 of PLD 100 in accordance with an embodiment of the invention. For example, tile template 210 includes a programmable logic block 212 that may be configured to implement look up tables (LUTs), registers, multiplexers, and other components. Tile template 210 also includes switches 222 and 224, and segmented wires S0, S1, and S2, which collectively may be used to provide part of routing resources 118 of PLD 100. Each of switches 222 and 224 may be used to selectively enable and disable connections between two segmented wires. For example, switch 222 may be used to connect segmented wires S0 and S1. Similarly, switch 224 may be used to connect segmented wires S1 and S2.

As shown in FIG. 2, tile template 240 includes a programmable logic block 242, switches 252, 254, and 256, and segmented wires labeled S0, S1, S2, S3, and S4. Similarly, tile template 270 includes a programmable logic block 272, switches 282 and 284, and segmented wires S0, S1, S2, and S3. The particular segmented wires associated with each of tile templates 210, 240, and 270 are further identified by sets 230, 260, and 280, respectively.

As also shown in FIG. 2, some of the segmented wires of tile templates 210, 240, and 270 are implemented as substantially straight wires connecting two circuit elements (for example, segmented wire S0 of tile template 210). Other segmented wires extend in a plurality of directions (for example, segmented wires S1 and S2 of tile template 210).

As further shown in FIG. 2, some of the segmented wires of tile templates 210, 240, and 270 are contained locally within each tile template. These wires are also referred to herein as local segmented wires. For example, tile template 210 includes local segmented wire S0, tile template 240 includes local segmented wires S1 and S2, and tile template 270 includes local segmented wires S2 and S3.

Other segmented wires of tile templates 210, 240, and 270 extend to the edges of their associated tile templates and may be used to connect with wires of other tile templates. These wires are also referred to herein as boundary segmented wires. For example, tile template 210 includes boundary segmented wires S1 and S2, tile template 240 includes boundary segmented wires S0, S3, and S4, and tile template 270 includes boundary segmented wires S0 and S1.

Figure 3:
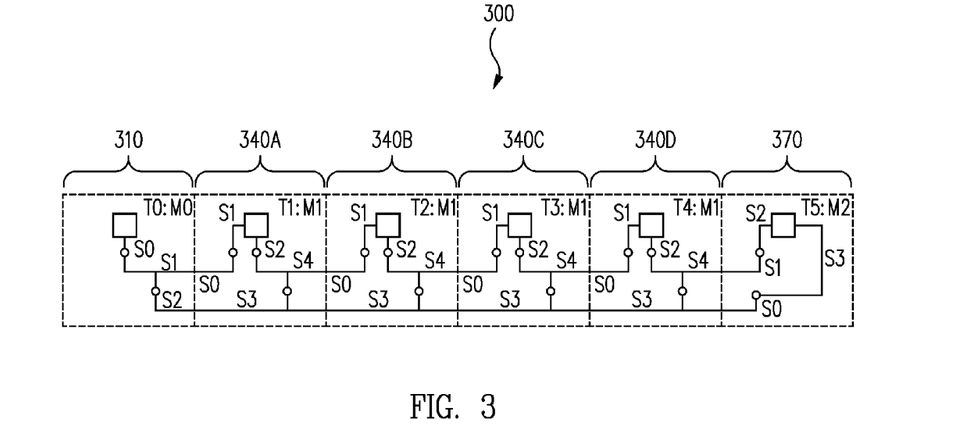
FIG. 3 illustrates a routing graph identifying a plurality of segmented wires in accordance with an embodiment of the invention.

Each of tile templates 210, 240, and 270 may be duplicated to provide a plurality of tiles that are used to provide programmable logic blocks 104 and routing resources 118 of PLD 100. In this regard, FIG. 3 illustrates a routing graph 300 of a plurality of tiles 310, 340A-D, and 370 in accordance with an embodiment of the invention. In one embodiment, tiles 310, 340A-D, and 370 may be used to implement at least a portion of programmable logic blocks 104 and routing resources 118 of PLD 100.

Upon review of FIGS. 2 and 3, it will be appreciated that tile templates 210, 240, and 270 have been used to implement tiles 310, 340A-D, and 370. For example, tile 310 (labeled T0:M0) corresponds to tile template 210, tiles 340A-D (labeled T1:M1 to T4:M1) correspond to tile template 240, and tile 370 (labeled T5:M2) corresponds to tile template 270. Accordingly, each of tiles 310, 340A-D, and 370 will have the wiring layout and components of their associated tile templates 210, 240, and 270, respectively.

As also shown in FIG. 3, boundary segmented wires S1 and S2 of tile 310 are connected with boundary segmented wires S0 and S3, respectively of tile 340A. Also, boundary segmented wires S3 and S4 of each of tiles 340A-C are connected with boundary segmented wires S3 and S0, respectively of tiles 340B-D. Furthermore, boundary segmented wires S3 and S4 of tile 340D are connected with boundary segmented wires S0 and S1, respectively, of tile 370.

In accordance with various processes further described herein, connected boundary segmented wires may be referenced together as composite wires of a PLD. For example, in one embodiment, a plurality of interface templates may be used to identify various boundary segmented wires that are connected between tiles corresponding to particular tile templates.

Figure 4:
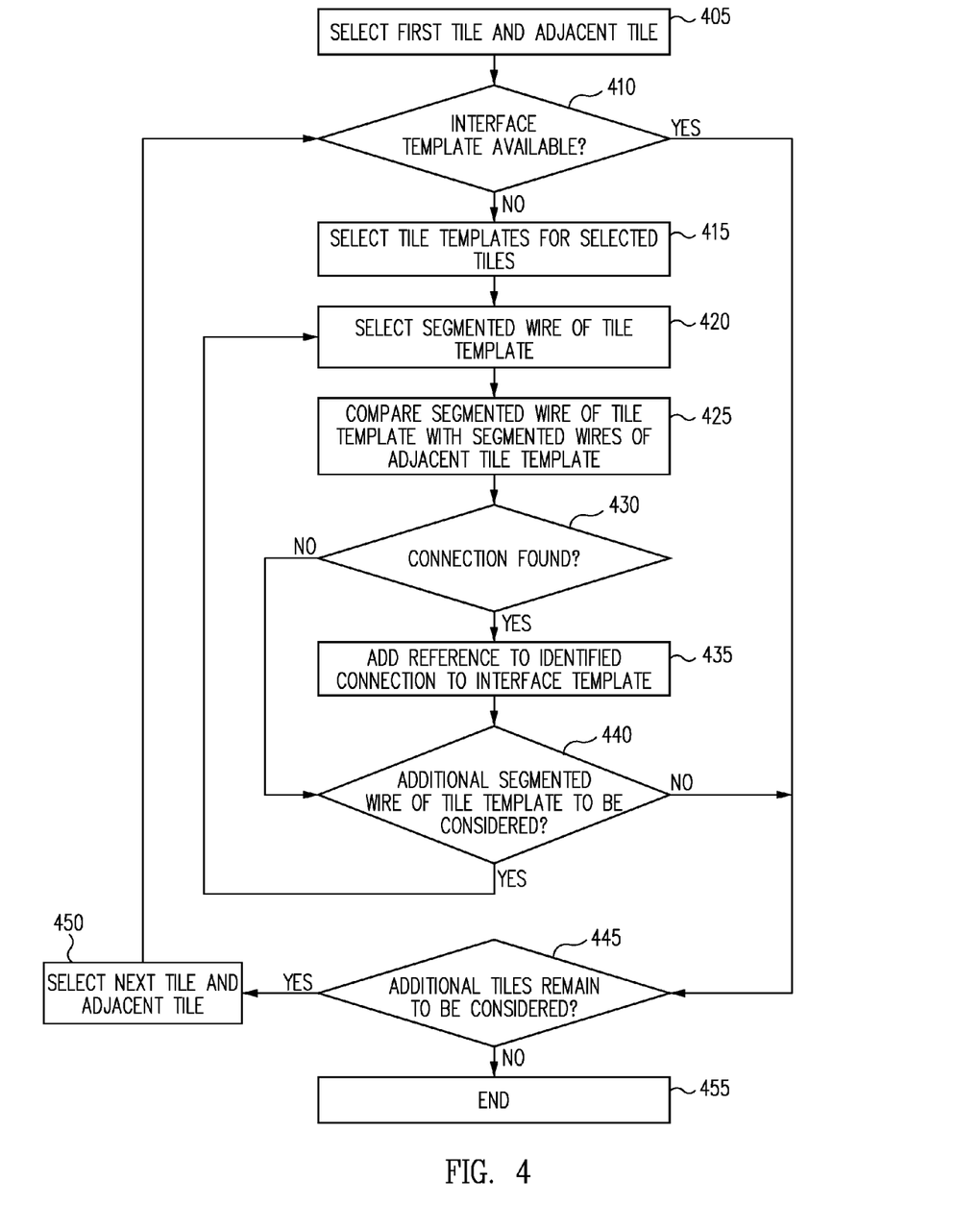
FIG. 4 illustrates a process of creating interface templates for adjacent tiles in accordance with an embodiment of the invention.
Figure 5:
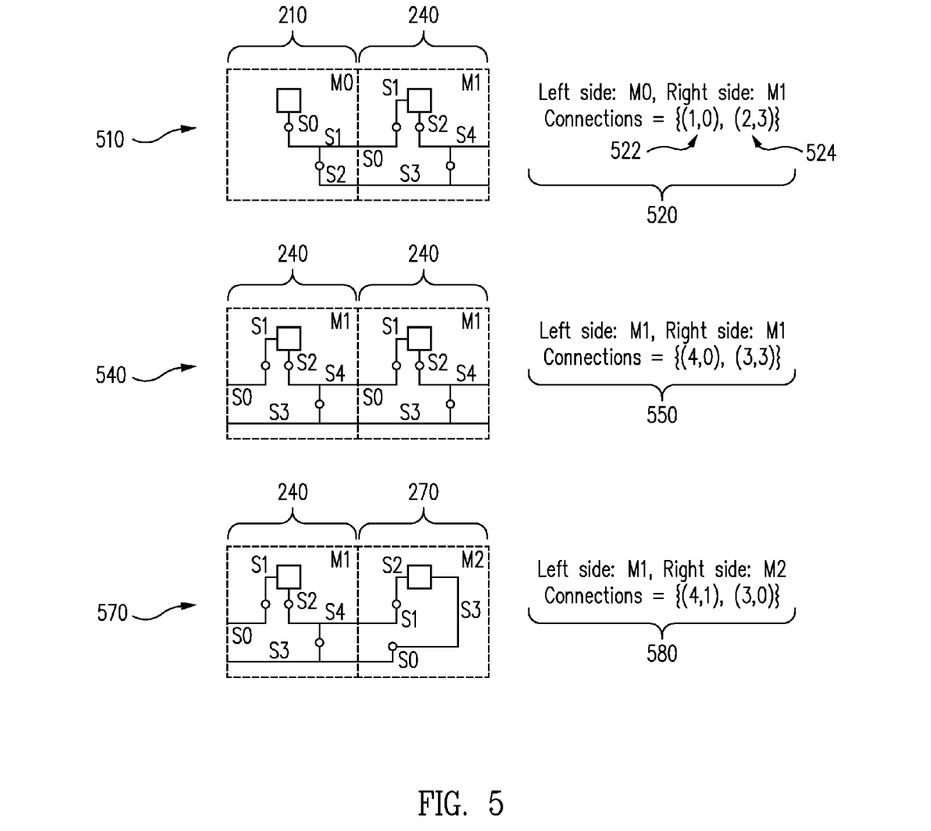
FIG. 5 illustrates a plurality of interface templates in accordance with an embodiment of the invention.

FIG. 4 illustrates a process of creating interface templates for adjacent tiles in accordance with an embodiment of the invention. For example, in one embodiment, the process of FIG. 4 may be performed by system 120 of FIG. 1. FIG. 5 illustrates a plurality of interface templates 510, 540, and 570 that may be created by the process of FIG. 4 and maintained by system 120 in accordance with an embodiment of the invention. Although the process of FIG. 4 will be described in relation to routing graph 400, tile templates 210, 240, and 270, and interface templates 510, 540, and 570, any desired routing graphs or tile templates may be used.

In step 405, system 120 selects a first tile and an adjacent tile of routing graph 300. For example, in one embodiment, tiles of routing graph 300 may be considered in order from left to right. Accordingly, tile 310 may be selected as the first tile and tile 340A may be selected as the adjacent tile in step 405.

In step 410, system 120 determines whether an interface template has already been created corresponding to the tiles selected in step 405. If an interface template corresponding to tiles 310 and 340A has already been created, then the process of FIG. 4 continues to step 445. However, in this embodiment, it is assumed that no interface templates have been created yet for the tiles of routing graph 300. Accordingly, in this embodiment the process of FIG. 4 continues to step 415.

In step 415, system 120 begins creating interface template 510 which identifies connections between segmented wires of tile templates 210 and 240 corresponding to tiles 310 and 340A, respectively, that were selected in step 405. Accordingly, in step 415, system 120 selects tile templates 210 and 240.

In step 420, system 120 selects a segmented wire of tile template 210. Then, in step 425 system 120 compares the selected segmented wire of tile template 210 with segmented wires of tile template 240 to determine whether the selected segmented wire of tile template 210 is connected with a segmented wire of tile template 240. If a connection if found (step 430), then the process continues to step 435. Otherwise, the process continues to step 440.

For example, if wire S1 of tile template 210 is selected in step 420, then segmented wire S1 of tile template 210 is compared to the various wires of tile template 240A in step 425. In this regard, memory 126 of system 120 may include data representing the location of segmented wires of each of tile templates 210, 240, and 270. By comparing the location of segmented wire S1 of tile template 210 to the locations of segmented wires of tile template 240A, system 120 can determine that segmented wire S1 of tile template 210 is connected with segmented wire S0 of template 240 when tile templates 210 and 240 are adjacent to each other.

In step 435, system 120 adds a reference to interface template 510 identifying the connection found in step 430. For example, as shown in FIG. 5, interface template 510 includes a set of ordered pairs 520 that identify connections between tile templates 210 and 240. In this regard, system 120 may maintain each ordered pair of set 520 in the format (a, b), where a and b identify segmented wires of tile templates 210 and 240, respectively.

For example, in the embodiment shown in FIG. 5, set 520 includes an ordered pair 522 which may be added to interface template 510 in step 435 of FIG. 4. In this regard, ordered pair 522 is provided in the form (1, 0) to identify a connection between segmented wire S1 of tile template 210 and segmented wire S0 of tile template 240 found in step 430.

In step 440, system 120 determines whether any additional segmented wires of tile template 210 remain to be considered. If no additional segmented wires of tile template 210 remain to be considered, then the process of FIG. 4 continues to step 445. However, in this embodiment, it is assumed that only segmented wire S1 of tile template 210 has been considered. Accordingly, in this embodiment the process of FIG. 4 returns to step 420 where another segmented wire (for example, segmented wire S1) of tile template 210 is selected.

It will be appreciated that the process of FIG. 4 may repeat steps 420 to 440 for all segmented wires of tile template 210. As a result, any additional connections between segmented wires of tile templates 210 and 240 may be identified as ordered pairs added to set 520 of interface template 510. For example, as shown in FIG. 5, an additional ordered pair 524 has been added to interface template 510 to identify a connection between segmented wires S2 and S3 of tile templates 210 and 240, respectively. After all segmented wires of tile template 210 have been considered, the process of FIG. 4 continues to step 445.

In step 445, system 120 determines whether any additional tiles of routing graph 300 remain to be considered. If no additional tiles remain to be considered, then the process of FIG. 4 ends (step 455). Otherwise, the process continues to step 450 where the next tile of routing graph 300 is selected.

For example, if only the connections between tiles 310 and 340A have been considered, then the process of FIG. 4 continues to step 450 where tile 340A and its adjacent tile 340B are selected. System 120 then repeats steps 410 to 440 to create interface template 540 shown in FIG. 5 which identifies a set of connections 550 between two of tile templates 240 using a plurality of ordered pairs in the manner previously described.

As illustrated in FIG. 4, system 120 repeats various steps of the process of FIG. 4 until all tiles of routing graph 300 have been considered. In this regard, it will be appreciated that because tiles 340B, 340C, and 340D all correspond to tile template 240, the connections between tiles 340B/340C and between tiles 340C/340D are identified by ordered pairs 550 of previously prepared tile template 540. In addition, the interface between tiles 340D/370 are identified by ordered pairs 580 of tile template 570.

After the process of FIG. 4 has been performed, system 120 will have prepared interface templates 510, 540, and 570 which identify the connection patterns between tile templates 210, 240, and 270 used to implement the tiles of routing graph 300. Using these interface templates 510, 540, and 570, system 120 can identify the particular boundary segmented wires connected between various tiles of routing graph 300.

Each segmented wire of routing graph 300 may be associated with an index value. As previously described, segmented wires sharing an index value may be viewed collectively as a composite wire comprising the individual segmented wires.

Figure 6:
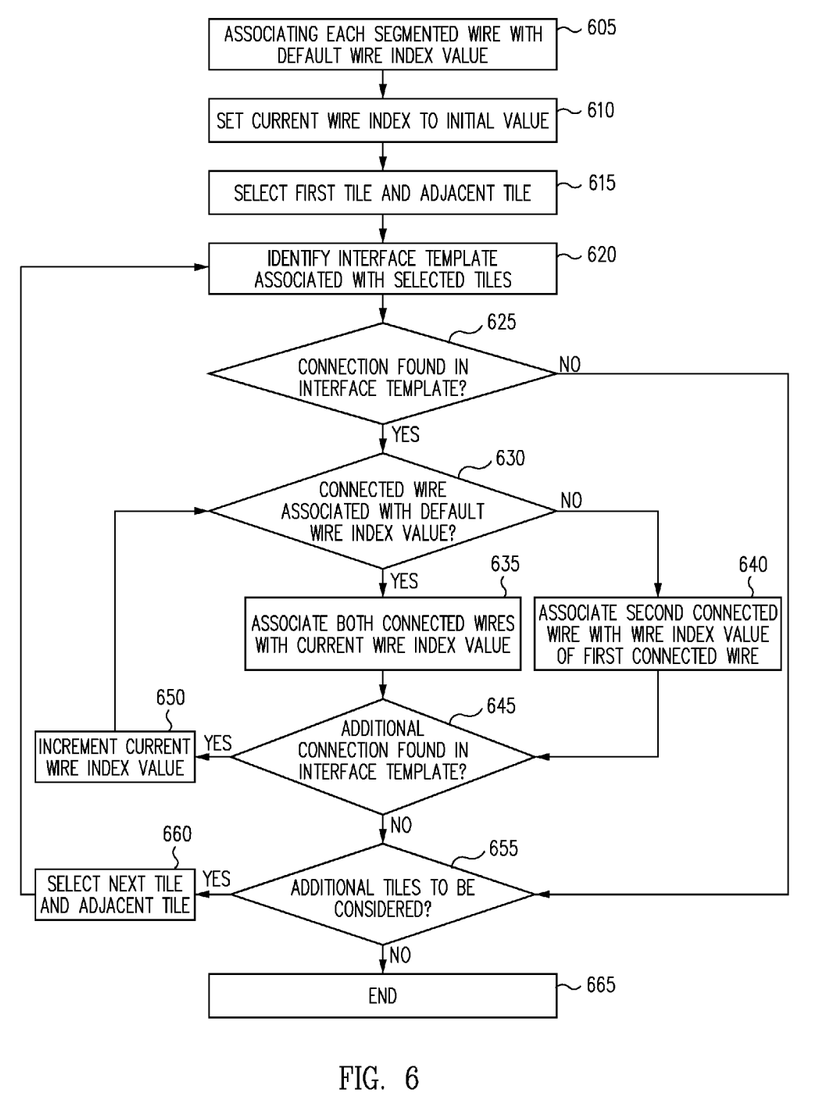
FIG. 6 illustrates a process of indexing boundary segmented wires in accordance with an embodiment of the invention.

FIG. 6 illustrates a process of indexing boundary segmented wires in accordance with an embodiment of the invention. In one embodiment, the process of FIG. 6 is performed following the process of FIG. 4. As further described herein, interface templates 510, 540, and 570 of FIG. 5 may be used to identify connections between boundary segmented wires of tiles of routing graph 300.

In one embodiment, each segmented wire of routing graph 300 may be represented by an ordered pair maintained by system 120 in the format: M(t, s), where t identifies a tile of routing graph 300, and s identifies a particular segmented wire of the identified tile. For example, segmented wire S1 of tile 310 may be identified by the ordered pair M(0, 1), where 0 refers to the label of tile 310 (e.g., T0) and where 1 identifies segmented wire S1. It will be appreciated that each segmented wire shown in routing graph 300 may be uniquely identified by such an ordered pair.

In step 605, system 120 associates each segmented wire of routing graph 300 with a default index value. For example, system 120 may create an ordered pair in the format M(t, s) described above for each segmented wire of routing graph 300, and associate all of the ordered pairs with a default index value, such as −1. Table 1 below illustrates one embodiment of a mapping table created in step 605 that includes an ordered pair for each segmented wire of tiles 310, 340A-D, and 370 of routing graph 300.

TABLE 1

| Tile 310 (T0) | M(0, 0) = −1 | M(0, 1) = −1 | M(0, 2) = −1 |
|---|---|---|---|
| Tile 340A (T1) | M(1, 0) = −1 | M(1, 1) = −1 | M(1, 2) = −1 |
| | M(1, 3) = −1 | M(1, 4) = −1 | |
| Tile 340B (T2) | M(2, 0) = −1 | M(2, 1) = −1 | M(2, 2) = −1 |
| | M(2, 3) = −1 | M(2, 4) = −1 | |
| Tile 340C (T3) | M(3, 0) = −1 | M(3, 1) = −1 | M(3, 2) = −1 |
| | M(3, 3) = −1 | M(3, 4) = −1 | |
| Tile 340D (T4) | M(4, 0) = −1 | M(4, 1) = −1 | M(4, 2) = −1 |
| | M(4, 3) = −1 | M(4, 4) = −1 | |
| Tile 370 (T5) | M(5, 0) = −1 | M(5, 1) = −1 | M(5, 2) = −1 |
| | M(5, 3) = −1 | | |

In addition to the default index value (e.g., −1) described above, system 120 may also maintain a current index that is selectively incremented. Accordingly, in step 610 system 120 sets the current index to an initial value. For example, in one embodiment, this initial value may correspond to zero. Therefore, in this embodiment, following step 610, each of the ordered pairs of Table 1 will be associated with an index value of −1, and the current index maintained by system 120 will be set to a value of zero.

In step 615, system 120 selects a first tile and an adjacent tile of routing graph 300. For example, in one embodiment, tiles of routing graph 300 may be considered in order from left to right. Accordingly, tile 310 may be selected as the first tile and tile 340A may be selected as the adjacent tile in step 615.

In step 620, system 120 identifies an interface template corresponding to the tiles selected in step 615. In this regard, it will be appreciated that following the process of FIG. 4 previously described above, system 120 will have interface templates 510, 540, and 570 corresponding to the various combinations of adjacent tiles present in routing graph 300. Accordingly, system 120 identifies one of interface templates 510, 540, or 570 in step 620. In this embodiment, because tiles 310 and 340A were selected in step 615, interface template 510 corresponding to tile templates 210 and 240 (which correspond to tiles 310 and 340A) will be identified in step 620.

In step 625, system 120 determines whether interface template 510 identifies any connections between tile templates 210 and 240. If a connection is found, the process continues to step 630. Otherwise, the process continues to step 655. As previously described, interface template 510 includes set of ordered pairs 520 which includes ordered pairs 522 and 524 identifying two connections between tile templates 210 and 240. Accordingly, in this embodiment, system 120 may identify a first one of the ordered pairs (for example, ordered pair 522) in step 625 which corresponds to the connection between segmented wires S1 and S0 of tile templates 210 and 240, respectively.

In step 630, system 120 determines whether the connected segmented wire of tile 310 corresponding to the connection identified in step 625 is set to the default composite wire index value. As shown in Table 1, ordered pair M(0, 1) is associated with the default composite wire index value of −1 which was set in previous step 605. Accordingly, the process of FIG. 6 will continue to step 635 where system 120 associates segmented wires S1 and S0 of tiles 310 and 340A with the current index value of zero. Therefore, in step 635, ordered pairs M(0, 1) and M(1, 0) of Table 1 may be changed to: M(0, 1)=0 and M(1, 0)=0.

In step 630, if ordered pair M(0, 1) is instead associated with an index value different from the default index value, then the process of FIG. 6 continues to step 640 where the second segmented wire of the identified connection (for example, segmented wire S0 of tile 340A) is associated with the index value of the first segmented wire of the identified connection.

Following step 635 or step 640, the process continues to step 645 where system 120 determines whether interface template 510 identifies an additional connection between tile templates 210 and 240. For example, in this embodiment, segmented wires S2 and S3 of tile templates 210 and 240, respectively, are connected. Accordingly, the process continues to step 650 where the current index value is incremented (for example, from 0 to 1). Steps 630 through 645 are then repeated for the additional connection. It will be appreciated that through repeated iterations of steps 630 to 650, system 120 identifies all connections between tile templates 210 and 240, and associates each wire of the corresponding connections between tiles 310 and 340A with an index value.

If no additional connections are found in step 645, then the process continues to step 655 where system 120 determines whether any additional tiles of routing graph 300 remain to be considered. If no additional tiles remain to be considered, then the process of FIG. 6 ends (step 665). Otherwise, the process continues to step 660 where the next tile of routing graph 300 and its adjacent tile are selected (for example, tiles 340A and 340B in this embodiment), and steps 620 through 660 are repeated until connections between all tiles of routing graph 300 are considered.

It will be appreciated that during the process of FIG. 6, boundary segmented wires of tiles 310, 340A-D, and 370 may be set to new index values if they are connected to other boundary segmented wires of adjacent tiles. For example, Table 2 below illustrates new index values associated with the ordered pairs corresponding to boundary segmented wires connected between tiles 310, 340A-D, and 370.

TABLE 2

| Tile 310 & 340A Connections: | M(0, 1) = 0 M(1, 3) = 1 | M(1, 0) = 0 | M(0, 2) = 1 |
|---|---|---|---|
| Tile 340A & 340B Connections: | M(1, 3) = 1 M(2, 0) = 2 | M(2, 3) = 1 | M(1, 4) = 2 |
| Tile 340B & 340C Connections: | M(2, 3) = 1 M(3, 0) = 3 | M(3, 3) = 1 | M(2, 4) = 3 |
| Tile 340C & 340D Connections: | M(3, 3) = 1 M(4, 0) = 4 | M(4, 3) = 1 | M(3, 4) = 4 |
| Tile 340D & 370 Connections: | M(4, 3) = 1 M(5, 1) = 5 | M(5, 0) = 1 | M(4, 4) = 5 |

As shown in Table 2 above, the boundary segmented wires connected between adjacent tiles are associated with the same index value. For example, segmented wires S1 and S0 of adjacent tiles 310 and 340A share a common index value of 0. In addition, boundary segmented wires that are connected across multiple tiles without any intervening switches or logic blocks are associated with the same index value. For example, segmented wires S2, S3, and S4 of tiles 310, 340A-D, and 370 share a common index value of 1.

Figure 7:
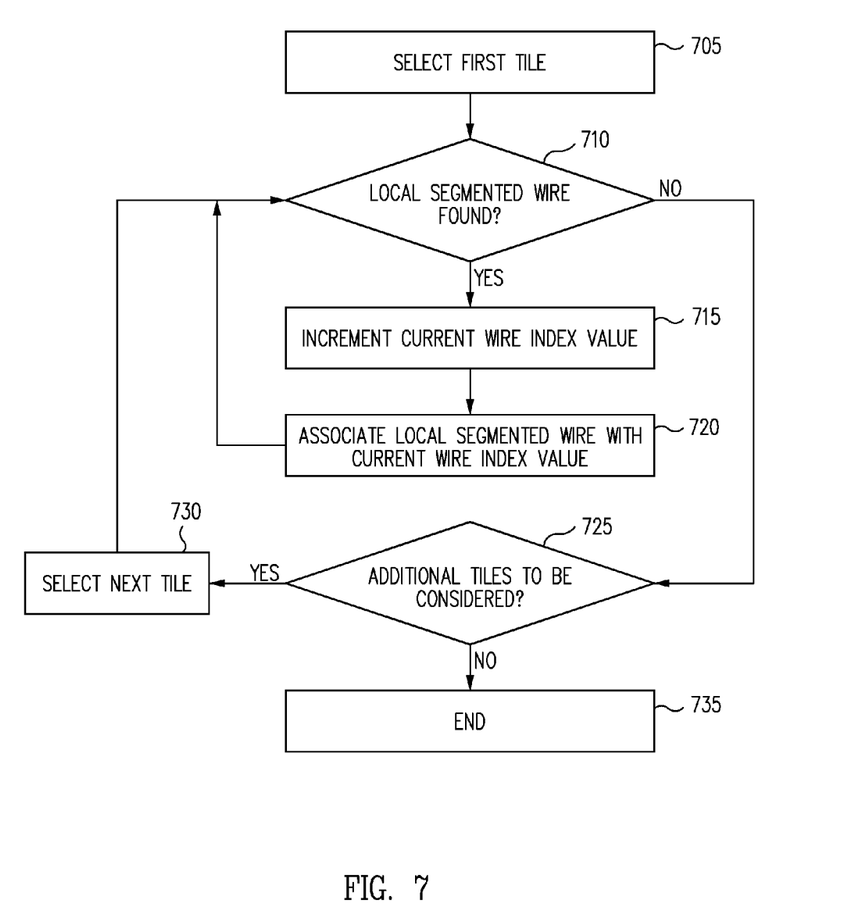
FIG. 7 illustrates a process of indexing local segmented wires in accordance with an embodiment of the invention.

FIG. 7 illustrates a process of indexing local segmented wires of individual tiles in accordance with an embodiment of the invention. In one embodiment, the process of FIG. 7 is performed following the process of FIG. 6. In step 705, system 120 selects a first tile of routing graph 300. For example, in one embodiment, tiles of routing graph 300 may be considered in order from left to right. Accordingly, tile 310 may be selected as the first tile in step 615.

In step 710, system 120 determines whether the first selected tile (e.g., tile 310 in this embodiment) includes a local segmented wire. In this regard, system 120 may compare a tile template corresponding to the selected tile with interface templates also corresponding to the selected tile. For example, as previously described, tile 310 corresponds to tile template 210 that includes segmented wires identified in set 230. In addition, tile template 210 is referenced by interface template 510 which also includes ordered pairs 520 that identify connections between tile templates 210 and 240. By comparing the segmented wires identified in set 230 with those identified by ordered pairs 520, system 120 can determine whether tile 310 includes local segmented wires. In particular, because ordered pairs 520 identify boundary segmented wires, any segmented wires identified in set 230 that are not identified by ordered pairs 520 will be local segmented wires. In this embodiment, tile 310 includes local segmented wire S0.

If no local segmented wires are found in step 710, then the process of FIG. 7 continues to step 725. However, if a local segmented wire is found in step 710, then the process of FIG. 7 continues to step 715.

In step 715, system 120 increments the current index previously described in relation to the process of FIG. 6. For example, in one embodiment reflected in Table 2 above, the current index may have been incremented up to a value of 5 during the process of FIG. 6. Accordingly, in this embodiment, the current index may be incremented in step 715 to a value of 6.

In step 720, system 120 associates the local segmented wire found in step 710 with the current index value. For example, continuing the embodiment described above, if local segmented wire S0 is found in step 710, then it may be associated with the current index value of 6 in step 720. Following step 720, the process of FIG. 7 returns to step 710 to determine whether the currently selected tile includes any additional local segmented wires. Accordingly, it will be appreciated that steps 710 to 720 may be repeated until all local segmented wires of the currently selected tile have been associated with new index values.

In step 725, system 120 determines whether routing graph 300 includes any additional tiles to be considered. If not, then the process of FIG. 7 ends (step 735). Otherwise, system 120 selects the next tile (for example, tile 340A) of routing graph 300 (step 730) and returns to step 710 to identify local segmented wires of the next tile (for example, local segmented wires S1 and S2 of tile 340A). It will be appreciated that the process of FIG. 7 will continue until all local segmented wires of tiles 310, 340A-D, and 370 have been associated with new index values.

For example, Table 3 below illustrates new index values associated with the ordered pairs corresponding to local segmented wires of tiles 310, 340A-D, and 370.

TABLE 3

| Tile 310 Local Segmented Wires: | M(0, 0) = 6 | |
|---|---|---|
| Tile 340A Local Segmented Wires: | M(1, 1) = 7 | M(1, 2) = 8 |
| Tile 340B Local Segmented Wires: | M(2, 1) = 9 | M(2, 2) = 10 |
| Tile 340C Local Segmented Wires: | M(3, 1) = 11 | M(3, 2) = 12 |
| Tile 340D Local Segmented Wires: | M(4, 1) = 13 | M(4, 2) = 14 |
| Tile 370 Local Segmented Wires: | M(5, 2) = 15 | M(5, 3) = 16 |

Figure 8:
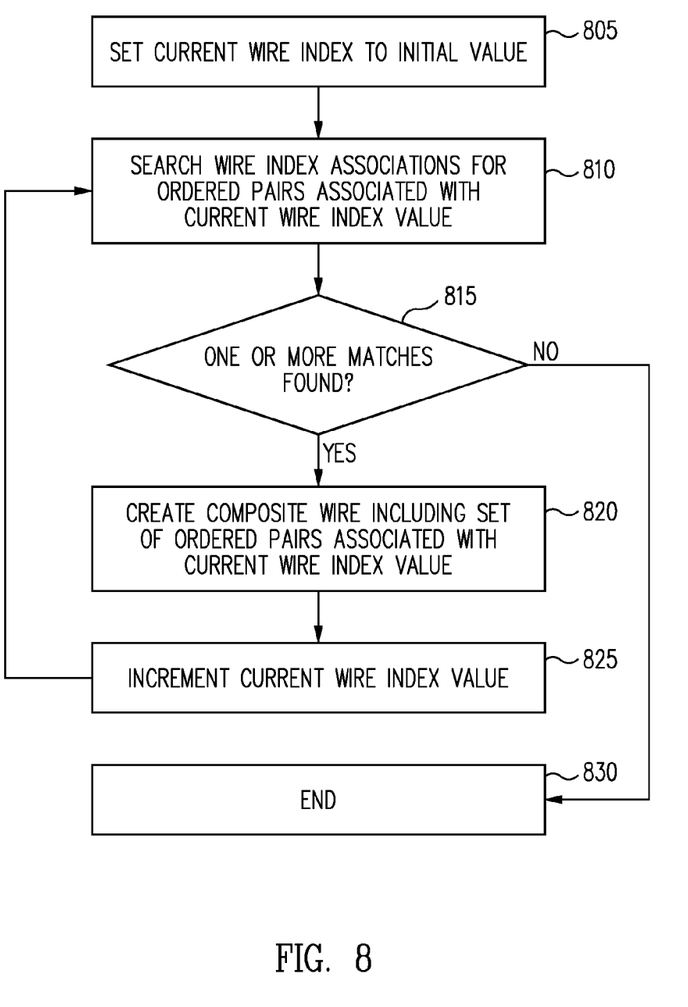
FIG. 8 illustrates a process of identifying composite wires in accordance with an embodiment of the invention.

FIG. 8 illustrates a process of identifying composite wires in accordance with an embodiment of the invention. In one embodiment, the process of FIG. 8 is performed following the process of FIG. 7.

In step 805, system 120 sets the current index previously described in relation to the process of FIG. 6 to an initial value (e.g., zero). In step 810, system 120 searches index associations of segmented wires of tiles 310, 340A-D, and 370 of routing graph 300 to identify segmented wires associated with the current index value. For example, in one embodiment, step 805 may include searching the ordered pairs set forth in Tables 2 and 3 above to identify any segmented wires associated with the current index value.

If one or more segmented wires matching the current index value are found (step 815), then the process of FIG. 8 continues to step 820. Otherwise, the process of FIG. 8 ends (step 830).

In step 820, system 120 creates a reference to a composite wire using the one or more segmented wires found in step 815. In one embodiment, a composite wire may be identified by a set of the ordered pairs in the format (t, s) identifying in the segmented wires found in step 815. For example, in one embodiment, a composite wire may be identified by a set in the format: Cx={(t, s), . . . , (t, s)}, where x corresponds to the composite wire number and each ordered pair (t, s) identifies a segmented wire (e.g., t identifies a tile of routing graph 300, and s identifies a particular segmented wire of the identified tile).

For example, using the associations set forth in Tables 2 and 3 above, if the current index has an initial value of zero, then ordered pairs M(0, 1) and M(1, 0) will be found in step 815 and used in step 820 to create a set of ordered pairs corresponding to a composite wire. In this case, a composite wire may be identified as a set of ordered pairs in the format: C0={(0, 1), (1,0)}.

In step 825, system 120 increments the current index value (for example, from 0 to 1). The process of FIG. 8 then returns to step 810 where system 120 searches index associations of segmented wires of tiles 310, 340A-D, and 370 of routing graph 300 to identify segmented wires associated with the new current index value.

It will be appreciated that the process of FIG. 8 will continue until composite wires have been identified using all index values associated with segmented wires of tiles 310, 340A-D, and 370 of routing graph 300. For example, Table 4 below identifies composite wires C0 through C16 identified using the ordered pairs of Tables 2 and 3.

TABLE 4

Composite Wires:

C0 = {(0, 1), (1, 0)}
C1 = {(0, 2), (1, 3), (2, 3), (3, 3), (4, 3), (5, 0)}
C2 = {(1, 4), (2, 0)}
C3 = {(2, 4), (3, 0)}
C4 = {(3, 4), (4, 0)}
C5 = {(4, 4), (5, 0)}
C6 = {(0, 0)}
C7 = {(1, 1)}
C8 = {(1, 2)}
C9 = {(2, 1)}
C10 = {(2, 2)}
C11 = {(3, 1)}
C12 = {(3, 2)}
C13 = {(4, 1)}
C14 = {(4, 2)}
C15 = {(5, 2)}
C16 = {(5, 3)}

Figure 9:
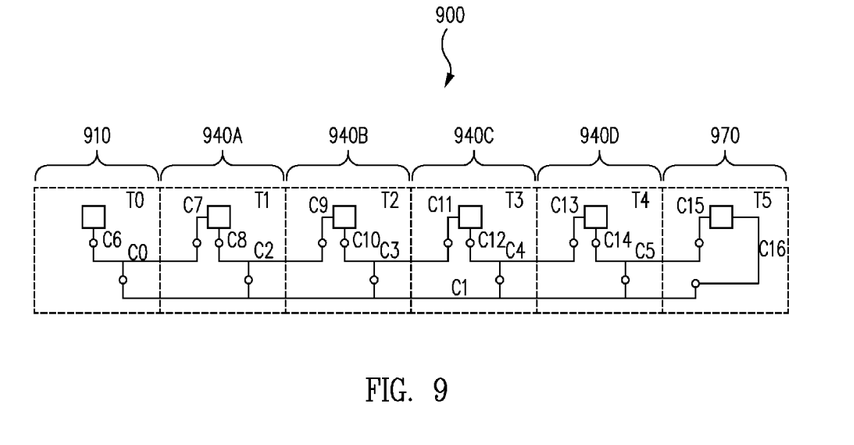
FIG. 9 illustrates a routing graph identifying a plurality of composite wires in accordance with an embodiment of the invention.

FIG. 9 illustrates a routing graph 900 identifying a plurality of composite wires C0 to C16 in accordance with an embodiment of the invention. It will be appreciated that routing graph 900 includes tiles 910, 940A-D, and 970 corresponding to tiles 310, 340A-D, and 370 of routing graph 300, but with the segmented wires renamed to identify composite wires C0 to C16 identified in Table 4 above. Advantageously, composite wires C0 to C16 may be referenced by system 120 when specifying interconnections between logic blocks and/or other components of PLD 100. For example, configuration data generated by system 120 may reference composite wires C0 to C16 rather than individual segmented wires.

Although routing graphs 300 and 900 described herein include tiles arranged in a single row, the concepts set forth herein may be applied to other tile configurations if desired. For example, routing graphs with tiles arranged in a plurality of rows and/or columns may be used. In this regard, tiles of such routing graphs may be selected in any order as may be desired. Similarly, appropriate interface templates may be created for adjacent tiles in any desired orientation.

In view of the present disclosure, it will be appreciated that the use of composite wire indexes described herein permits system 120 to reference multiple segmented wires together as composite wires without repeatedly creating, merging, and deleting segmented wire information as additional segmented wires are added to the composite wires. Moreover, by using interface templates to identify segmented wire connectivity patterns between adjacent tiles, system 120 need not search for individual segmented wires on a case-by-case basis for each interconnected logic block when generating configuration data to implement a desired logic design.

Embodiments described above illustrate but do not limit the invention. It should also be understood that numerous modifications and variations are possible in accordance with the principles of the present invention. Accordingly, the scope of the invention is defined only by the following claims.

We claim:

1. A computer-implemented method of referencing wires of a programmable logic device (PLD), the method comprising:

identifying in a computer a plurality of tiles within the PLD, wherein a tile corresponds to a tile template, the tile template including one or more programmable logic blocks, switches, and segmented wires;

selecting in the computer first and second adjacent tiles from the identified tiles;

selecting in the computer first and second tile templates corresponding to the first and second tiles;

comparing in the computer a segmented wire of the first tile template to a segmented wire of the second tile template to determine whether the segmented wires are connected; and for a wire connection found between the first and second tile templates, creating in the computer an interface template and including in the interface template a reference to the wire connection.

2. The method of claim 1, wherein the reference to the wire connection includes an ordered pair of the connected segmented wires.

3. The method of claim 1 including:

associating in the computer the connected segmented wires of the reference with a same wire index value.

4. The method of claim 3 including for each additional reference to a wire connection in the interface template:

incrementing the wire index value; and associating in the computer the connected segmented wires of the reference with the incremented wire index value.

5. The method of claim 3 including:

setting in the computer a wire index value to a current value;

identifying in the computer the connected segmented wires having the current wire index value; and creating in the computer a composite wire from the identified segmented wires.

6. The method of claim 5 including:

incrementing the current wire index value; and repeating the identifying, creating and incrementing steps to create additional composite wires.

7. The method of claim 5, wherein the setting step includes setting the wire index value to an initial value.

8. The method of claim 5, wherein the composite wire is adapted to interconnect programmable logic blocks of the PLD.

9. The method of claim 5 including:

generating in the computer configuration data for the PLD, wherein the configuration data includes a reference to the composite wire.

10. A non-transient computer readable medium on which is stored a computer program that when executed by a computer performs a method of referencing wires of a programmable logic device (PLD), the method comprising:

identifying in a computer a plurality of tiles within the PLD, wherein a tile corresponds to a tile template, the tile template including one or more programmable logic blocks, switches, and segmented wires;

selecting in the computer first and second adjacent tiles from the identified tiles;

selecting in the computer first and second tile templates corresponding to the first and second tiles;

comparing in the computer a segmented wire of the first tile template to a segmented wire of the second tile template to determine whether the segmented wires are connected; and for a wire connection found between the first and second tile templates, creating in the computer an interface template and including in the interface template a reference to the wire connection.

11. The computer readable medium of claim 10, wherein the reference to the wire connection includes an ordered pair of the connected segmented wires.

12. The computer readable medium of claim 10, wherein the method includes:

associating in the computer the connected segmented wires of the reference with a same wire index value.

13. The computer readable medium of claim 10, wherein the method includes for each additional reference to a wire connection in the interface template:

incrementing the wire index value; and associating in the computer the connected segmented wires of the reference with the incremented wire index value.

14. The computer readable medium of claim 10, wherein the method includes:

setting in the computer a wire index value to a current value;

identifying in the computer the connected segmented wires having the current wire index value; and creating in the computer a composite wire from the identified segmented wires.

15. The computer readable medium of claim 14, wherein the method includes:

incrementing the current wire index value; and repeating the identifying, creating and incrementing steps to create additional composite wires.

16. The computer-readable medium of claim 14, wherein the setting step includes setting the wire index value to an initial value.

17. The computer readable medium of claim 14, wherein the composite wire is adapted to interconnect programmable logic blocks of the PLD.

18. The computer readable medium of claim 14, wherein the method includes:

generating in the computer configuration data for the PLD, wherein the configuration data includes a reference to the composite wire.

* * * * *